United States Patent [19]

Miura et al.

[11] Patent Number: 5,302,256
[45] Date of Patent: Apr. 12, 1994

[54] IMMERSION TIN/LEAD ALLOY PLATING BATH

[75] Inventors: Takeshi Miura, Oomiya; Masaru Seita, Ina; Shigeru Kodaira, Kiyose, all of Japan

[73] Assignee: LeaRonal Japan Inc., Tokyo, Japan

[21] Appl. No.: 898,448

[22] Filed: Jun. 15, 1992

[30] Foreign Application Priority Data

Jun. 25, 1991 [JP] Japan .................. 3-153480

[51] Int. Cl.⁵ ............................ B05D 1/18
[52] U.S. Cl. ..................... 205/85; 427/437; 427/443.1; 106/1.27; 106/1.22
[58] Field of Search ............ 205/85; 427/438, 443.1, 427/437; 106/1.27, 1.22

[56] References Cited

U.S. PATENT DOCUMENTS 4,844,739 7/1989 Josso et al. ............... 427/438

FOREIGN PATENT DOCUMENTS 174384 7/1987 Japan .
184279 7/1989 Japan .

OTHER PUBLICATIONS

Chemical Abstract 108:10173w Jan. 11, 1988.

Primary Examiner—John Niebling
Assistant Examiner—Kishor Mayekar
Attorney, Agent, or Firm—Emmanuel J. Lobato; Robert E. Burns

[57] ABSTRACT

An immersion tin/lead alloy plating bath has a basic composition comprising an organic sulfonic acid, divalent tin and lead salts of the organic sulfonic acid and thiourea and further contains thiocyanic acid or derivative thereof, optionally with hydrated hydrazine. With this plating bath, an alloy deposit, which has a particularly desired Sn/Pb ratio of 60%/40% or so and is improved in terms of adhesion and homogeneity, can be stably obtained on the surface of copper or a copper alloy in a relatively low temperature region within a short span of time.

11 Claims, 1 Drawing Sheet

IMMERSION TIN/LEAD ALLOY PLATING BATH

BACKGROUND OF THE INVENTION

1. Field of the Invention

The present invention relates to a novel immersion tin/lead alloy plating bath and, more specifically, to an immersion tin/lead alloy plating bath preferably used for plating copper and copper alloys.

2. Prior Art

Immersion tin/lead alloy plating can be applied to the copper of independent circuit patterns in which it is difficult to make the portions to be plated electrically conductive, such as electronic parts and geometrically complicated parts or printed circuits.

Conventional immersion tin/lead alloy plating bath compositions known so far in the art contain stannous chloride and lead chloride as metal salts, thiourea as a chelating agent and hydrazine hydrochloride as a reducing agent (Japanese Patent Laid-Open Publication No. 64527/1974) or tin borofluoride and lead borofluoride as metal salts, thiourea as a chelating agent, sodium hypophosphite as a reducing agent and a surface active agent, borofluoric acid, etc. as additives (Japanese Patent Laid-Open Publications Nos. 211565/1984 and 211566/1984). Another bath is available, which contains an organic sulfonic acid and its divalent tin and lead salts, sodium hypophosphite as a reducing agent and thiourea as a chelating agent together with hydroxycarboxylic acids and various surface active agents (Japanese Patent Laid-Open Publication No. 184279/1989).

As mentioned above, various compositions have so far been developed as immersion tin/lead alloy plating baths, but they are generally so slow in the deposition rate of tin/lead that an ample deposit thickness cannot be obtained; that is, the obtained deposit thickness is of the order of 1 μm. In addition, this type of tin/lead alloy plating may be achieved at various tin/lead ratios, as is well known in the art. Although it is now desired to obtain a deposit having an Sn/Pb ratio of 60%/40% or so, because it has the lowest melting point and so can be easily soldered at low temperatures, with the conventional plating baths it is difficult to provide stably deposits especially at this Sn/Pb ratio. Further, the temperatures of the plating baths lie in a relatively high temperature region, say, ordinarily 60° to 80° C.

An object of the present invention is therefore to solve the problems associated with the prior art by providing an immersion tin/lead alloy plating bath which can produce a tin/lead alloy film of enough thickness and improved adhesion and homogeneity onto copper or a copper alloy at various Sn/Pb ratios, especially an Sn/Pb ratio of 60%/40% or so in a relatively low temperature region within a short period of time.

SUMMARY OF THE INVENTION

As a result of our studies and experiments, it has now been found that the above object is attainable by adding thiocyanic acid or its derivative, optionally with hydrated hydrazine, to a bath containing an organic sulfonic acid, divalent tin and lead salts of the organic sulfonic acid and thiourea.

According to one aspect of the present invention, there is provided an immersion tin/lead alloy plating bath characterized by having a basic composition comprising at least one organic sulfonic acid selected from an alkane sulfonic acid, an alkanol sulfonic acid and an aromatic sulfonic acid, divalent tin and lead salts of said organic sulfonic acid or acids, and thiourea as a chelating agent and further containing at least one of thiocyanic acid and derivative thereof as an additive.

According to another aspect of the present invention, hydrated hydrazine is optionally added as an antioxidant for tin to the above immersion tin/lead alloy plating bath.

BRIEF DESCRIPTION OF THE DRAWINGS

The present invention will now be described specifically but not exclusively with reference to the accompanying drawings, in which.

DETAILED DESCRIPTION OF THE INVENTION

Figure 1:
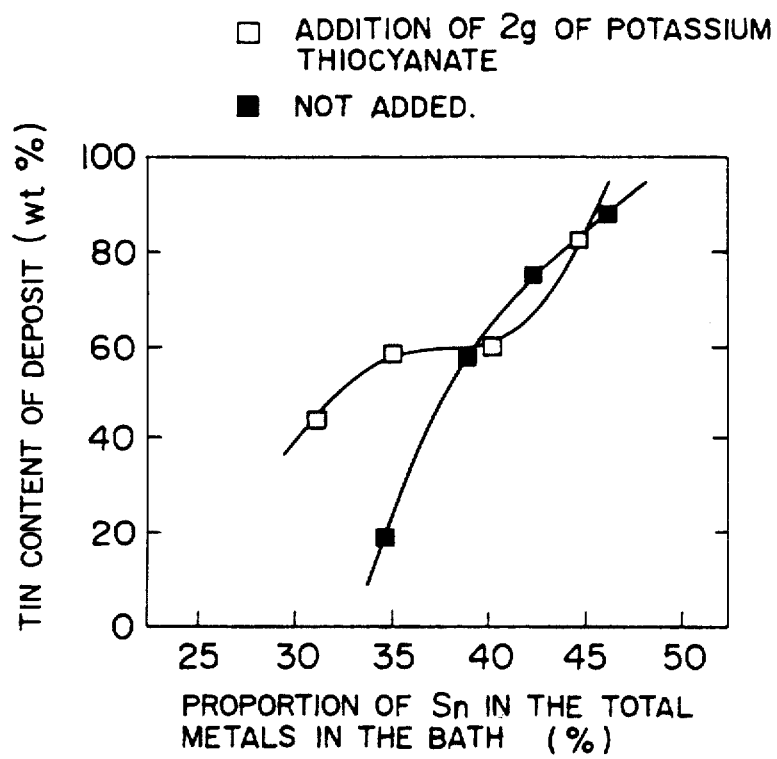
FIG. 1 is a graph showing the relation between the proportion of Sn in the total metals in the bath and the deposition rate of Sn in Example 1 wherein potassium thiocyanate was added and Comparative Example 1 wherein any additive was not added.

The plating bath according to the present invention has a basic composition comprising an organic sulfonic acid, divalent tin and lead salts of the organic sulfonic acid which act as metal salts and thiourea which serves as a chelating agent.

The organic sulfonic acid used in the present invention is at least one selected from an alkane sulfonic acid, an alkanol sulfonic acid and an aromatic sulfonic acid.

The alkane sulfonic acid used in the present invention has the following formula (1):

$$R_1SO_3H \qquad (1)$$

wherein $R_1$ stands for an alkyl group having 1 to 6 carbon atoms. By way of example alone, reference may be made to methane sulfonic acid, ethane sulfonic acid, propane sulfonic acid, 2-propane sulfonic acid, butane sulfonic acid, 2-butane sulfonic acid, pentane sulfonic acid and hexane sulfonic acid.

The alkanol sulfonic acid used in the present invention has the following formula (2):

$$(R_2)_n-\underset{\underset{OH}{|}}{R}-SO_3H \qquad (2)$$

wherein R stands for an alkyl group having 1-3 carbon atoms; $R_2$, which may be located at any desired position, denotes an alkyl group having 1 to 3 carbon atoms, a hydroxyl group or a sulfonic acid group; and n represents an integer of 0 to 3. By way of example alone, reference may be made to 2-hydroxyethyl-1-sulfonic acid, 2-hydroxypropyl-1-sulfonic acid, 3-hydroxypropyl-1-sulfonic acid, 2-hydroxybutyl-1-sulfonic acid, 4-hydroxypentyl-1-sulfonic acid and 2-hydroxyhexyl-1-sulfonic acid.

The aromatic sulfonic acid used in the present invention has the following formula (3):

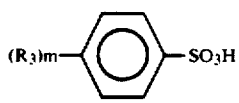

(3)

wherein $R_3$ stands for an alkyl group having 1 to 3 carbon atoms, an alkylaryl group having a $C_{0-3}$ alkyl group, a Carboxyl group or a sulfonic acid group; and m represents an integer of 0 to 3. By way of example alone, reference may be made to benzenesulfonic acid, 4-hydroxybenzenesulfonic acid and 4-carboxybenzenesulfonic acid. Besides, use may be made of aromatic disulfonic acids such as 2,5-dihydroxy-1,4-benzenedisulfonic acid and 4,5-dihydroxy-1,3-benzenedisulfonic acid.

In the present invention, the divalent tin and lead salts of the organic sulfonic acid are used as metal salts. The above organic sulfonic acid may be different from or identical with those of the above divalent tin and lead salts used as metal salts. For instance, the alkane sulfonic acid may be used in combination with the tin and lead salts of an alkanol sulfonic acid. Alternatively, identical or different alkane sulfonic acids may be used. For instance, methane sulfonic acid may be used in combination with the tin and lead salts of methane or ethane sulfonic acid. The tin and lead salts are ordinarily formed by the same organic sulfonic acid, but they may be formed by different organic sulfonic acids. The tin or lead salts of organic sulfonic acids may be used alone or in combination of two or more.

The addition of the organic sulfonic acid is effective for preventing precipitation of the above metal salts, increasing the deposit thickness and preventing varying deposition, etc. The amount of the sulfonic acid added lies normally in the range of 5 to 300 g/l, preferably, 50 to 200 g/l. On the other hand, the respective amounts of the tin and lead salts of the organic sulfonic acid added lie normally in the range of 5 to 200 g/l, preferably, 30 to 100 g/l. For the present invention a tin/lead alloy deposit having an Sn/Pb ratio of 60%/40% or so is particularly desired; the tin and lead salts of the organic sulfonic acid should be added in the proportion corresponding thereto. However, it is noted that if required, the present invention is advantageously applicable to tin/lead alloy deposits desired to have different Sn/Pb ratios. In this case, the tin and lead salts should be used in the proportion corresponding to such ratios.

In addition to the organic sulfonic acid and the divalent tin and lead salts of the organic sulfonic acid which act as metal salts, thiourea is added to the bath as a chelating agent which allows copper dissolved from the surface of copper by a substitution reaction during plating of the surface of copper to be stably maintained in a solution. The quantity of thiourea added lies normally in the range of 30 to 200 g/l, preferably 50 to 150 g/l.

The present invention is characterized in that thiocyanic acid or derivative thereof is added as an additive to the plating bath having a basic composition comprising the organic sulfonic acid, the metal salts thereof and thiourea. It has now been found that with the immersion plating bath containing this additive, a tin/lead alloy deposit which is of ample thickness, say, about 2 to 4 μm and has a desired Sn/Pb ratio can be stably obtained in a relatively low-temperature region. Especially because tin and lead form an eutectic from the initial stage of plating and are subsequently deposited at a virtually identical ratio, a tin/lead alloy deposit having an Sn/Pb ratio of 60%/40% or so can be obtained stably and homogeneously.

The thiocyanic acid or derivative thereof added to the bath of the present invention may include, in addition to thiocyanogen and thiocyanic acid, thiocyanates such as ammonium, potassium and sodium thiocyanates, thiocyanato complex compounds such as thiocyanatocobaltate and thiocyanatoammine copper salt, (iso) thiocyanic esters such as methyl thiocyanate, benzyl thiocyanate and methyl isothiocyanate, alkylene thiocyanates such as ethylene thiocyanate and butylene dithiocyanate, thiocyanic acid polymers such as hydrogenated xanthane and perthiocyanates. These may be used alone or in combination of two or more.

This thiocyanic acid or derivative thereof is used in an amount of normally 0.2 to 20 g/l, preferably, 0.5 to 10 g/l.

If required, hydrated hydrazine is used in this invention as well. With this hydrazine, it is possible to prevent oxidation of divalent tin ions into tetravalent tin ions and extend the plating bath life. Unlike hydrazine hydrochloride, the hydrated hydrazine contains no halogen and so serves well. The hydrated hydrazine is used in an amount of normally 0.1 to 50 g/l, preferably, 2 to 20 g/l.

The present immersion tin/lead alloy plating bath having such a composition is ordinarily used in a pH range of at most 2 so as to prevent precipitation of the tin and lead salts. However, care should be taken with regard to pH, because too low a pH or strong acidity is often unsuitable for certain types of electronic parts. In some cases, the present bath may thus be used at a pH increased to 2 or more by the addition of a suitable chelating agent, e.g., sodium gluconate. The present bath may also be suitably used in a temperature region of 40° to 90° C. that is relatively lower than before. The deposition rate is so high that a tin/lead alloy deposit which is of ample thickness, say, about 2 to 4 μm, and has improved homogeneity and adhesion can be obtained within a dipping time as short as about 5 to 10 minutes.

It is understood that prior to immersion plating with the bath of this invention, the material to be plated is pretreated as in the conventional practice. Typically, the material is first degreased with an alkali or acid at 60° C. for 3 minutes, washed with water, soft-etched at 25° C. for 2 minutes, washed with water, activated with an acid at 25° C. for 1 minute and finally washed with water. After that, it is immersion-plated, washed with water and dried. In this connection, it is noted that even when the material to be plated is not dried prior to plating, it is possible to obtain a homogeneous, grayish white and lusterless deposit. The pretreatments, the same as those carried out prior to the pattern plating of a printed circuit board, were applied to the examples and comparative examples given below.

In these examples, an insulator formed of glass epoxy material, which is used as the substrate of a printed circuit board, was catalyzed thereon with palladium and then plated with an electroless copper plating and with an electrolytic copper plating using a copper sulphate bath to form a copper through-hole substrate. After that substrate had been coated thereon with a solder mask serving as a resist, it was dipped in a bath having a varying composition for immersion tin/lead plating. After immersion tin/lead plating, the substrate was printed with cream solder, and a surface mounting device (SMD) such as a semiconductor chip was then mounted thereon for soldering finish by heating. When plating was carried out without recourse to the present bath, not only was any desired deposit not obtained within a short time, but good wettability was not obtained during soldering as well, resulting in a drop of bonding properties. However, when plating was performed with the present bath, such difficulties were fully eliminated.

EXAMPLES

Example 1

| Methane sulfonic acid | 100 g/l |
|---|---|
| Tin methanesulfonate | 52 g/l |
| Lead methanesulfonate | 58 g/l |
| Thiourea | 80 g/l |
| Potassium thiocyanate | 2 g/l |

An immersion tin/lead alloy plating bath composed of the above components was prepared. While this bath was maintained at a bath temperature of 50° C., a copper through-hole substrate coated with a solder mask was dipped therein for 10 minutes. As a result, a 3.2-μm thick, grayish-white, lusterless and homogeneous tin/lead alloy deposit was obtained on the copper at an Sn/Pb ratio of 61%/39%. Then, an SMD was mounted on the substrate which had been printed with cream solder for the purpose of estimation. As a result, it was found that the substrate showed excellent bonding properties with respect to the solder.

Plating was conducted four times with this bath containing potassium thiocyanate, and whenever one plating cycle was completed, the relation between the proportion of Sn in the total metals in the bath and the content of Sn in the deposit was examined. From the results shown by symbol □ in FIG. 1, it is evident that alloy deposits having a desired Sn/Pb ratio were almost constantly obtained.

Example 2

| Methane sulfonic acid | 100 g/l |
|---|---|
| Tin methanesulfonate | 52 g/l |
| Lead methanesulfonate | 58 g/l |
| Thiourea | 80 g/l |
| Potassium thiocyanate | 2 g/l |
| Hydrated hydrazine | 10 g/l |

An immersion tin/lead alloy plating bath composed of the above components was prepared. While this bath was maintained at 50° C., a copper through-hole substrate coated with a solder mask was treated following the above pretreatment procedures and then dipped therein for 10 minutes. As a result, a 3.2-μm thick, grayish-white, lusterless and homogeneous tin/lead alloy deposit was obtained on the copper at an Sn/Pb ratio of 61%/39%. Then, an SMD was mounted on the substrate which had been printed with cream solder for the purpose of estimation. As a result, it was found that the substrate showed excellent bonding properties with respect to the solder. The addition of hydrated hydrazine was effective for preventing oxidation of divalent tin ions into tetravalent tin ions; it could almost double the bath life.

Figure 2:
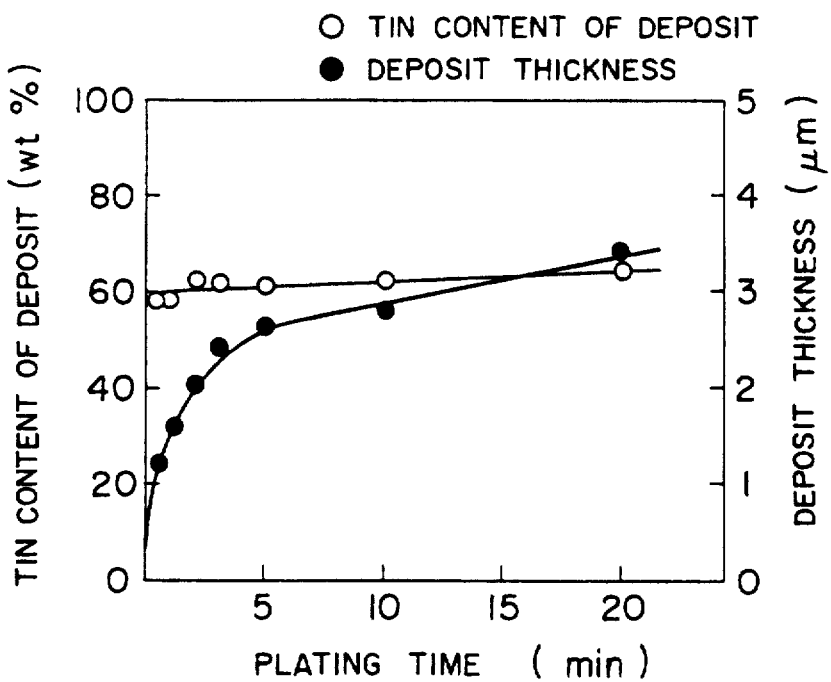
FIG. 2 is a graph showing the relations between the plating time, deposit thickness and deposition rate in Example 2.

Changes in the content of Sn in the deposit and the deposit thickness during the 10-minute dipping according to this example are shown in FIG. 2. As can be seen from FIG. 2, a deposit having an Sn/Pb ratio close to -60%/40% was almost stably obtained from the initial stage of plating, and a sufficient deposit thickness of about 3 μm was obtained at the end of plating.

Example 3

| Tin phenol-4-sulfonate | 50 g/l |
|---|---|
| Methane sulfonic acid | 50 g/l |
| Tin 2-hydroxypropanesulfonate | 50 g/l |
| Lead 2-hydroxypropanesulfonate | 60 g/l |
| Thiourea | 80 g/l |
| Ammonium thiocyanate | 1.5 g/l |
| Hydrated hydrazine | 5 g/l |

An immersion tin/lead alloy plating bath composed of the above components was prepared. While this bath was maintained at 50° C., a copper through-hole substrate coated with a solder mask was treated following the above pretreatment procedures and then dipped therein for 10 minutes. As a result, a 3.5-μm thick, grayish-white, lusterless and homogeneous tin/lead alloy deposit was obtained on the copper at an Sn/Pb ratio of 63%/37%. Then, an SMD was mounted on the substrate which had been printed with cream solder for the purpose of estimation. As a result, it was found that the substrate showed excellent bonding properties with respect to the solder.

Example 4

| 3-hydroxypropane sulfonic acid | 120 g/l |
|---|---|
| Tin phenol-4-sulfonate | 60 g/l |
| Lead phenol-4-sulfonate | 72 g/l |
| Thiourea | 80 g/l |
| Ethylene thiocyanate | 2.5 g/l |
| Hydrated hydrazine | 5 g/l |

An immersion tin/lead alloy plating bath composed of the above components was prepared. While this bath was maintained at 50° C., a copper through-hole substrate coated with a solder mask was treated following the above pretreatment procedures and then dipped therein for 10 minutes. As a result, a 2.9-μm thick, grayish-white, lusterless and homogeneous tin/lead alloy deposit was obtained on the copper at an Sn/Pb ratio of 60%/40%. Then, an SMD was mounted on the substrate which had been printed with cream solder for the purpose of estimation. As a result, it was found that the substrate showed excellent bonding properties with respect to the solder.

Example 5

| Ethane sulfonic acid | 80 g/l |
|---|---|
| Tin hydroxyethanesulfonate | 55 g/l |
| Lead hydroxyethanesulfonate | 62 g/l |
| Thiourea | 80 g/l |
| Sodium thiocyanatocobaltate | 3 g/l |
| Hydrated hydrazine | 5 g/l |

An immersion tin/lead alloy plating bath composed of the above components was prepared. While this bath was maintained at 50° C., a copper through-hole substrate coated with a solder mask was treated following the above pretreatment procedures and then dipped therein for 10 minutes. As a result, a 3.3-μm thick, grayish-white, lusterless and homogeneous tin/lead alloy deposit was obtained on the copper at an Sn/Pb ratio of 60%/40%. Then, an SMD was mounted on the substrate which had been printed with cream solder for the purpose of estimation. As a result, it was found that the substrate showed excellent bonding properties with respect to the solder.

Example 6

| Ethane sulfonic acid | 120 g/l |
|---|---|
| Tin ethanesulfonate | 55 g/l |
| Lead ethanesulfonate | 62 g/l |
| Thiourea | 80 g/l |
| Potassium thiocyanate | 1 g/l |
| Methyl isothiocyanate | 1 g/l |
| Hydrated hydrazine | 10 g/l |

An immersion tin/lead alloy plating bath composed of the above components was prepared. While this bath was maintained at 50° C., a copper through-hole substrate coated with a solder mask was treated following the above pretreatment procedures and then dipped therein for 10 minutes. As a result, a 3.9-μm thick, grayish-white, lusterless and homogeneous tin/lead alloy deposit was obtained on the copper at an Sn/Pb ratio of 64%/36%. Then, an SMD was mounted on the substrate which had been printed with cream solder for the purpose of estimation. As a result, it was found that the substrate showed excellent bonding properties with respect to the solder.

Example 7

| Methane sulfonic acid | 100 g/l |
|---|---|
| Tin methanesulfonate | 52 g/l |
| Lead methanesulfonate | 58 g/l |
| Thiourea | 80 g/l |
| Ammonium thiocyanate | 1 g/l |
| Butylene dithiocyanate | 1.5 g/l |
| Hydrated hydrazine | 10 g/l |

An immersion tin/lead alloy plating bath composed of the above components was prepared. While this bath was maintained at 50° C., a copper through-hole substrate coated with a solder mask was treated following the above pretreatment procedures and then dipped therein for 10 minutes. As a result, a 3.2-μm thick, grayish-white, lusterless and homogeneous tin/lead alloy deposit was obtained on the copper at an Sn/Pb ratio of 61%/39%. Then, an SMD was mounted on the substrate which had been printed with cream solder for the purpose of estimation. As a result, it was found that the substrate showed excellent bonding properties with respect to the solder.

Comparative Example 1

| Methane sulfonic acid | 100 g/l |
|---|---|
| Tin methanesulfonate | 52 g/l |
| Lead methanesulfonate | 58 g/l |
| Thiourea | 80 g/l |

An immersion tin/lead alloy plating bath composed of the above components was prepared. While this bath was maintained at 50° C., a copper through-hole substrate coated with a solder mask was treated following the above pretreatment procedures and then dipped therein for 10 minutes. As a result, a 0.9-μm thick, grayish-white, lusterless and homogeneous tin/lead alloy deposit was obtained on the copper at an Sn/Pb ratio of 81%/19%. Then, an SMD was mounted on the substrate which had been printed with cream solder for the purpose of estimation. As a result, it was found that the deposit was poorly wetted by and poorly bonded to the solder.

Plating was conducted four times with this thiocyanic acid-free bath according to Comp. Ex. 1, and whenever one plating cycle was completed, the relation between the proportion of Sn in the total metals in the bath and the content of Sn in the deposit was examined. From the results shown by symbol  in FIG. 1, it is evident that the resultant alloy deposit always varied in terms of the Sn/Pb ratio.

With the above immersion tin/lead alloy plating bath according to the present invention wherein thiocyanic acid or its derivative is used as an additive, it is possible to achieve desirable effects much better than those obtained with conventional immersion tin/lead alloy plating baths, as described below.

(1) Plating can be carried out in a relatively low temperature region (of the order of 50° to 60° C.).

(2) A deposit of practically sufficient thickness (of the order of 2 to 4 μm) can be obtained on copper and copper alloys within a short time (of the order of 5 to 10 minutes).

(3) A tin/lead alloy deposit having a particularly desired Sn/Pb ratio of 60%/40% can be easily obtained.

(4) The present bath is greatly economical, because its life can be increased by adding hydrated hydrazine thereto as a reducing agent.

(5) The present bath is applicable to electronic parts such as semiconductors due to the absence of such halogens as chlorine and fluorine.

The present bath is usable as an alternative to a hot air leveller for printed circuit boards and as a metal etching resist for forming circuits by the subtractive method, and lends itself best fit for plating leads of electronic parts or geometrically complicated parts as well. Heretofore, substrates for surface mounting technique (SMT) have been undercoated for bonding by electroless nickel/immersion gold plating, but this gives rise to some problems or, more specifically, involves complicated steps and incurs considerable expense. However, the tin/lead alloy deposit obtained by the present bath is comparable to that obtained by electroless nickel/immersion gold plating in terms of bonding properties, and is inexpensive due to simplified steps. Thus, the present invention can be said to constitute an industrial breakthrough.

What is claimed is:

1. An immersion tin/lead alloy plating bath having a basic composition comprising at least one organic sulfonic acid selected from the group consisting of an alkane sulfonic acid, an alkanol sulfonic acid and an aromatic sulfonic acid, divalent tin and lead salts of said organic sulfonic acid or acids, and thiourea as a chelating agent and further containing at least one of thiocyanic acid and derivative thereof as an additive.

2. The plating bath according to claim 1, wherein further hydrated hydrazine is added as an antioxidant for tin.

3. The plating bath according to claim 1, wherein the alkane sulfonic sulfonic acid has the following formula:

$$R_1SO_3H$$

wherein $R_1$ stands for an alkyl group having 1 to 6 carbon atoms.

4. The plating bath according to claim 1, wherein the alkanol sulfonic acid has the following formula

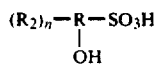

wherein R stands for an alkyl group having 1 to 3 carbon atoms; $R_2$, which may be located at any position, denotes an alkyl group having 1 to 3 carbon atoms, a hydroxyl group or a sulfonic acid group; and n represents an integer of 0 to 3.

5. The plating bath according to claim 1 wherein the aromatic sulfonic acid has the following formula

wherein $R_3$ stands for an alkyl group having 1 to 3 carbon atoms, an alkylaryl group having a $C_{0-3}$ alkyl group, a carboxyl group or a sulfonic acid group; and m represents an integer of 0 to 3.

6. The plating bath according to claim 1, wherein the organic sulfonic acid is used in an amount of 5 to 300 g/l.

7. The plating bath according to claim 1, wherein the divalent tin and lead salts of the organic sulfonic acid or acids is used in an amount of 5 to 200 g/l.

8. The plating bath according to claim 1, wherein thiourea is used in an amount of 30 to 200 g/l.

9. The plating bath according to claim 1, wherein the derivative of thiocyanic acid is selected from a group consisting of thiocyanates, thiocyanato complex compounds, (iso) thiocyanic ester, alkylene thiocyanates and thiocyanic acid polymer.

10. The plating bath according to claim 1, wherein thiocyanic acid or derivative thereof is used in an amount of 0.2 to 20 g/l.

11. The plating bath according to claim 2, wherein said hydrated hydrazine is used in an amount of 0.1 to 50 g/l.

* * * * *